United States Patent
Han et al.

(10) Patent No.: US 7,660,174 B2
(45) Date of Patent: Feb. 9, 2010

(54) SEMICONDUCTOR MEMORY DEVICE HAVING WAFER BURN-IN TEST MODE

(75) Inventors: Hi-Hyun Han, Kyoungki-do (KR); Jee-Yul Kim, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 170 days.

(21) Appl. No.: 12/005,853

(22) Filed: Dec. 28, 2007

(65) Prior Publication Data

US 2009/0116322 A1    May 7, 2009

(30) Foreign Application Priority Data

Nov. 26, 2007   (KR) .................... 10-2007-0112492

(51) Int. Cl.
*G11C 29/00* (2006.01)
(52) U.S. Cl. .................................... 365/201
(58) Field of Classification Search ............... 365/201, 365/230.06
See application file for complete search history.

(56) References Cited

U.S. PATENT DOCUMENTS

| | | | |
|---|---|---|---|
| 5,638,331 A * | 6/1997 | Cha et al. ............... | 365/201 |
| 6,259,638 B1 * | 7/2001 | Kim ........................ | 365/201 |
| 6,414,890 B2 * | 7/2002 | Arimoto et al. ......... | 365/201 |
| 6,996,753 B2 * | 2/2006 | Cho ......................... | 714/718 |

FOREIGN PATENT DOCUMENTS

| | | |
|---|---|---|
| KR | 10-0182973 B1 | 12/1998 |
| KR | 10-0259336 B1 | 3/2000 |
| KR | 10-2003-0051030 A | 6/2003 |
| KR | 10-2007-0036600 A | 4/2007 |

\* cited by examiner

*Primary Examiner*—Anh Phung
(74) *Attorney, Agent, or Firm*—Blakely, Sokoloff, Taylor & Zafman LLP (57) ABSTRACT

A semiconductor memory device includes an enable signal generator configured to generate an enable signal in response to a plurality of burn-in test signals; a test mode signal generator configured to generate a plurality of peripheral region test mode signals and a plurality of core region test mode signals corresponding to the burn-in test signals in response to the enable signal; a core region controller configured to control circuits in a core region in response to the core region test mode signals; and a peripheral region controller configured to control circuits in a peripheral region in response to the peripheral region test mode signals.

18 Claims, 5 Drawing Sheets

SEMICONDUCTOR MEMORY DEVICE HAVING WAFER BURN-IN TEST MODE

CROSS-REFERENCE TO RELATED APPLICATIONS

The present invention claims priority of Korean patent application number 10-2007-0112492, filed on Nov. 6, 2007, which is incorporated by reference in its entirety.

BACKGROUND OF THE INVENTION

The present invention relates to semiconductor design technology, and more particularly, to a semiconductor memory device having a wafer burn-in test mode.

In general, semiconductor memory devices such as DDR SDRAM (Double Data Rate Synchronous DRAM) have a variety of test modes for screening unstable circuit in the devices. Among the above modes, a burn-in test mode is used to screen unstable circuits in a semiconductor memory device by applying a stress such that the semiconductor memory device operates with a high driving voltage at a high temperature.

Examples of the burn-in test mode are a wafer burn-in test mode for performing a burn-in test in a wafer level, and a packet burn-in test mode for performing a burn-in test in a packet level after completion of a wafer test.

In general, because a small number of pads are used, a wafer burn-in test mode is used to screen defects only in a core region of the device where a band including a plurality of cell arrays is disposed. Thereafter, a package burn-in test mode is used to screen defects not only in the core region but also in a peripheral region where reading/writing/precharging circuits are disposed.

Figure 1:
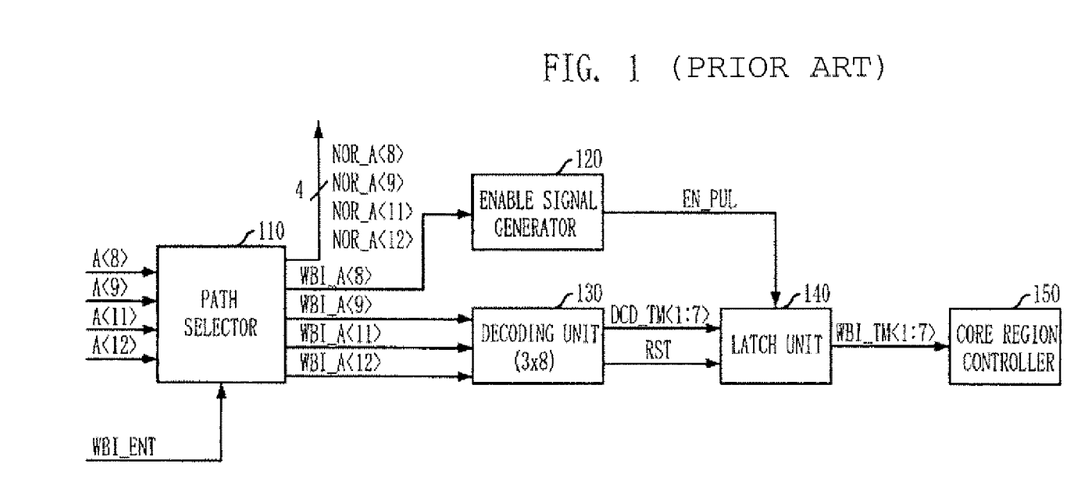
FIG. 1 is a partial block diagram of a conventional semiconductor memory device having a wafer burn-in test mode.

FIG. 1 is a partial block diagram of a conventional semiconductor memory device having a wafer burn-in test mode. For reference, a pad to which an external power voltage is applied, a pad to which a ground voltage is applied, a pad to which an internal power voltage is applied, a pad to which a wafer burn-in mode signal WBI_ENT is applied, and 'A<8>, A<9>, A<11>, A<12>' address pads are used in a wafer burn-in test mode.

Referring to FIG. 1, the conventional semiconductor memory device includes a path selector 110, an enable signal generator 120, a decoding unit 130, a latch unit 140, and a core region controller 150.

In response to a wafer burn-in mode signal WBI_ENT, the path selector 110 outputs signals, that are received through an 'A<8>' address pad, an 'A<9>' address pad, an 'A<11>' address pad, and an 'A<12>' address pad, to normal transmission paths NOR_A<8>, NOR_A<9>, NOR_A<11> and NOR_A<12> or test transmission paths WBI_A<8>, WBI_A<9>, WBI_A<11> and WBI_A<12>.

The enable signal generator 120 receives a signal through the 'WBI_A<8>' test transmission path corresponding to the 'A<8> address pad, and generates an enable signal EN_PUL that is activated for a predetermined period. The enable signal EN_PUL is used to control a signal input operation of the latch unit 140. When the enable signal EN_PUL is activated, several wafer burn-in test mode signals are input into the latch unit 140.

Figure 2:
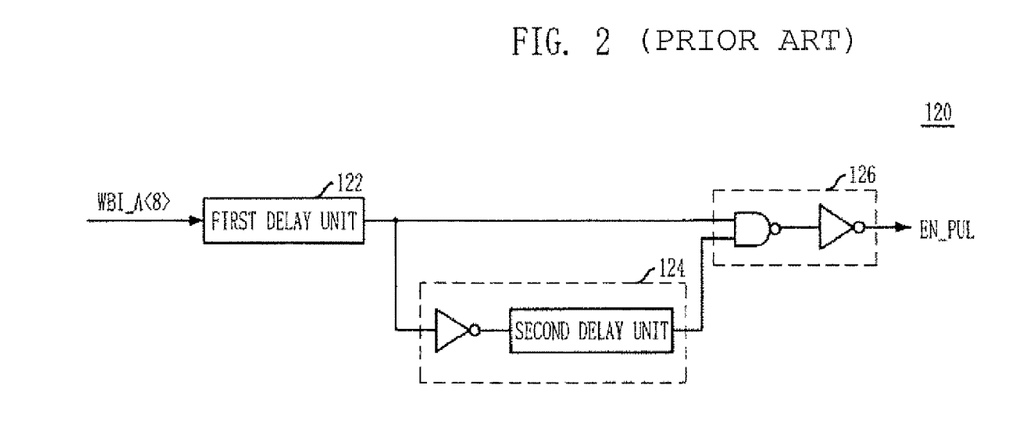
FIG. 2 is a diagram illustrating an enable signal generator of FIG. 1.

FIG. 2 is a diagram illustrating the enable signal generator 120 of FIG. 1.

Referring to FIG. 2, the enable signal generator 120 includes a first delay unit 122, an inverting delay unit 124, and an output unit 126. The first delay unit 122 delays the signal received through the 'WBI_A<8> test transmission path by a predetermined time. The inverting delay unit 124 inverts the output signal of the first delay unit 122 and delays the resulting signal by a predetermined period. The output unit 126 receives the output signal of the first delay unit 122 and the output signal of the inverting delay unit 124 to output the enable signal EN_PUL. The output enable signal EN_PUL is a pulse signal that has a pulse width reflected in the inverting delay unit 124.

Referring again to FIG. 1, the decoding unit 130 decodes signals received through the test transmission paths WBI_A<9>, WBI_A<11> and WBI_A<12> to generate a plurality of decoding signals DCD_TM<1:7> and a reset signal RST. Thus, the decoding unit 130 is a 3×8 decoder that receives signals through the test transmission paths WBI_A<9>, WBI_A<11> and WBI_A<12> to output seven decoding signals DCD_TM<1:7> and a reset signal RST.

In response to the enable signal EN_PUL output from the enable signal generator 120, the latch unit 140 latches the seven decoding signals DCD_TM<1:7> output form the decoding unit 130 and outputs seven test mode signals WBI_TM<1:7>. The latch unit 140 is initialized in response to the reset signal RST output from the decoding unit 130.

The core region controller 150 controls a plurality of cell arrays disposed in a core region according to seven test mode signals WBI_TM<1:7>, so that stresses can be applied to the cell arrays in seven wafer burn-in test modes. For example, under the control of the core region controller 150, all word lines connected to all the cell arrays, odd-numbered word lines, even-numbered word lines, or a given word line may be driven to apply a stress to the corresponding cell array.

The simple operation of FIG. 1 will be described below.

In the wafer burn-in test mode, the signals received through the 'A<8>' address pad, the 'A<9>' address pad, the 'A<11>' address pad, and the 'A<12>' address pad are transmitted to the test transmission paths WBI_A<8>, WBI_A<9>, WBI_A<11> and WBI_A<12> according to the wafer burn-in mode signal WBI_ENT. The signals transmitted through the test transmission paths WBI_A<9>, WBI_A<11> and WBI_A<12> are decoded to generate seven decoding signals DCM_TM<1:7> and a reset signal RST. The decoding signals DCM_TM<1:7> are latched in response to the enable signal EN_PUL, outputted as seven test mode signals WBI_TM<1:7>, and input into the core region controller 150. The core region controller 150 applies a stress to the cell array in up to seven wafer burn-in test modes.

As described above, the wafer burn-in test mode uses a small number of pads and thus is sufficient for screening only the defects in the core region. Therefore, a new test mode cannot be added.

Also, because too many word lines are driven in the wafer burn-in test mode, the stress conditions for a sense amplifier cannot be created easily. Therefore, it is difficult to screen a sense amplifier.

SUMMARY OF THE INVENTION

Embodiments of the present invention are directed to providing a semiconductor memory device that can apply a stress not only to a core region but also to a peripheral region related to the refresh operation, by providing additional burn-in test modes without increasing the number of pads used.

Embodiments of the present invention are also directed to providing a semiconductor memory device that can operate a refresh circuit in a peripheral region in a wafer burn-in test mode.

Embodiments of the present invention are also directed to providing a semiconductor memory device that can create the condition where a stress can be applied to a sense amplifier in a wafer burn-in test mode.

The present invention uses as many pads as conventionally used, and uses also a signal transmitted through a 'WBI_A<8> address pad to generate a test mode signal. Thus, the semiconductor memory device can have more wafer burn-in test modes. The additional test modes can be used to apply a stress to circuits disposed in the peripheral region. In particular, the present invention can create stress conditions for a sense amplifier in the wafer burn-in test mode by operating the refresh circuit.

In accordance with an aspect of the present invention, there is provided a semiconductor memory device including an enable signal generator configured to generate an enable signal in response to a plurality of burn-in test signals; a test mode signal generator configured to generate a plurality of peripheral region test mode signals and a plurality of core region test mode signals corresponding to the burn-in test signals in response to the enable signal; a core region controller configured to control circuits in a core region in response to the core region test mode signals; and a peripheral region controller configured to control circuits in a peripheral region in response to the peripheral region test mode signals.

In accordance with another aspect of the present invention, there is provided A semiconductor memory device including an enable signal generator configured to generate an enable signal in response to a plurality of burn-in test signals; a decoding unit configured to decode the burn-in test signals to generate a plurality of decoding signals; a core region test mode signal output unit configured to operate in response to the enable signal and to output a plurality of core region test mode signals in response to the decoding signal corresponding to a core region; a refresh test mode signal output unit configured to operate in response to the enable signal and to output a refresh test mode signal in response to the decoding signal corresponding to a refresh operation; a core region controller configured to control circuits in a core region in response to the core region test mode signals; and a refresh controller configured to control circuits related to a refresh operation in response to the refresh test mode signal and a refresh normal mod signal.

DESCRIPTION OF SPECIFIC EMBODIMENTS

Hereinafter, a semiconductor memory device having a wafer burn-in test mode in accordance with the present invention will be described in detail with reference to the accompanying drawings.

Figure 3:
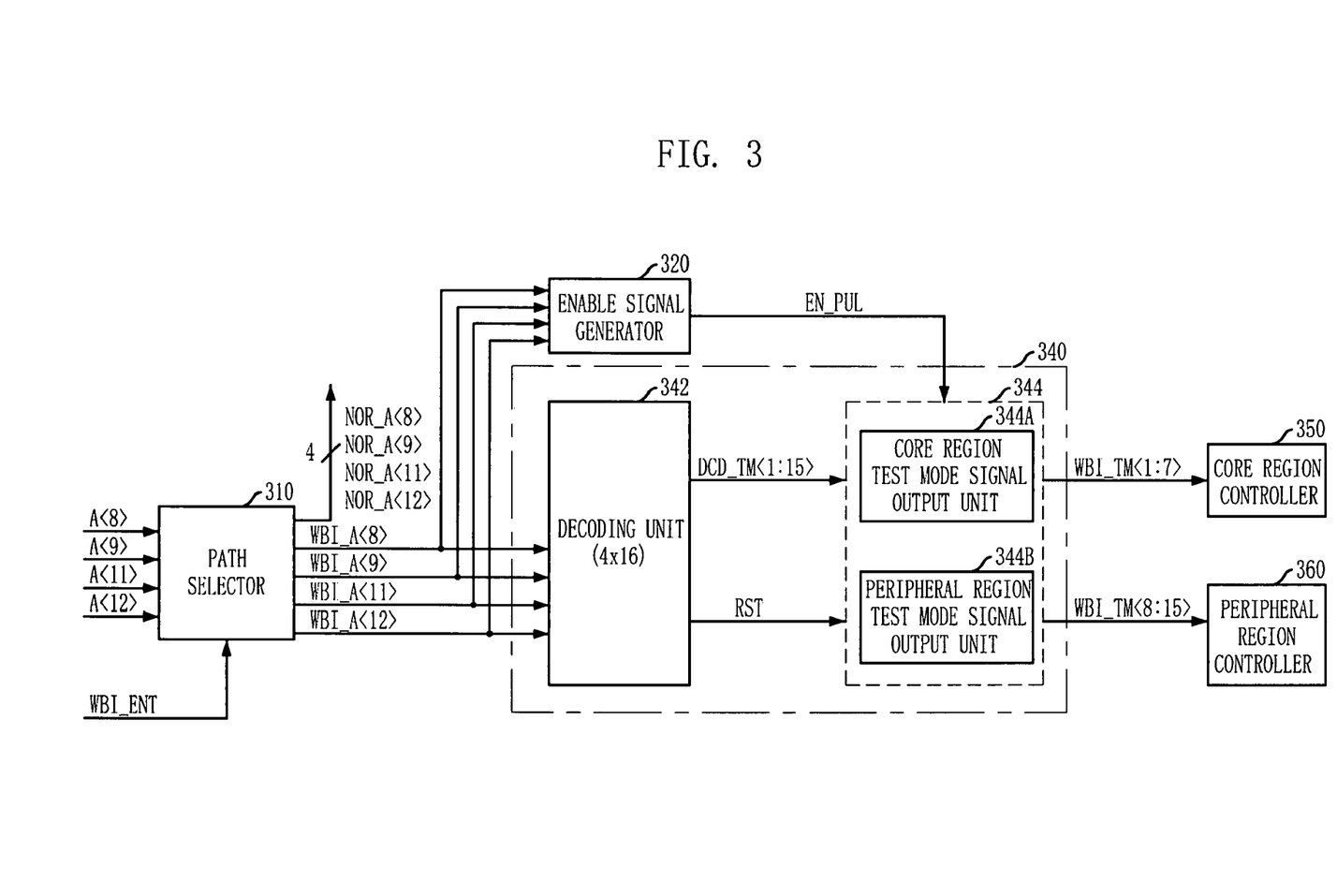
FIG. 3 is a partial block diagram of a semiconductor memory device having a wafer burn-in test mode in accordance with an embodiment of the present invention.

FIG. 3 is a partial block diagram of a semiconductor memory device having a wafer burn-in test mode in accordance with an embodiment of the present invention.

Using as many pads as conventionally used, the present invention can generate additional test mode signals as well as a test mode signal for testing a core region. Thus, for a wafer burn-in test mode, the present invention uses a pad to which an external power voltage is applied, a pad to which a ground voltage is applied, a pad to which an internal power voltage is applied, and 'A<8>, A<9>, A<11>, A<12>' address pads.

Referring to FIG. 3, the semiconductor memory device includes a path selector 310, an enable signal generator 320, a test mode signal generator 340, a core region controller 350, and a peripheral region controller 360.

In response to a wafer burn-in mode signal WBI_ENT, the path selector 310 outputs signals, which are received through an 'A<8>' address pad, an 'A<9>' address pad, an 'A<11>' address pad, and an 'A<12>' address pad, to normal transmission paths NOR_A<8>, NOR_A<9>, NOR_A<11> and NOR_A<12> or test transmission paths WBI_A<8>, WBI_A<9>, WBI_A<11> and WBI_A<12>.

For example, in a wafer burn-in test mode, signals received though the 'A<8>' address pad, the 'A<9>' address pad, the 'A<11>' address pad, and the 'A<12>' address pad are output to the test transmission paths WBI_A<8>, WBI_A<9>, WBI_A<11> and WBI_A<12> in response to the wafer burn-in mode signal WBI_ENT. In a normal mode (i.e., an operation mode in a package state), signals received though the 'A<8>' address pad, the 'A<9>' address pad, the 'A<11>' address pad, and the 'A<12>' address pad are output to the normal transmission paths NOR_A<8>, NOR_A<9>, NOR_A<11> and NOR_A<12>.

The enable signal generator 320 receives burn-in test signals through the test transmission paths WBI_A<8>, WBI_A<9>, WBI_A<11> and WBI_A<12> corresponding to the 'A<8>' address pad, the 'A<9>' address pad, the 'A<11>' address pad, and the 'A<12>' address pad, and generates an enable signal EN_PUL that is activated for a predetermined period.

Herein, the enable signal EN_PUL is a pulse signal that has a pulse width corresponding to a predetermined period in response to an activation point of at least one of the burn-in test signals received through the test transmission paths WBI_A<8>, WBI_A<9>, WBI_A<11> and WBI_A<12>. The enable signal EN_PUL may be activated when a variety of test mode signals are input into a core region test mode signal output unit 344A and a peripheral region test mode signal output unit 344B.

Figure 4:
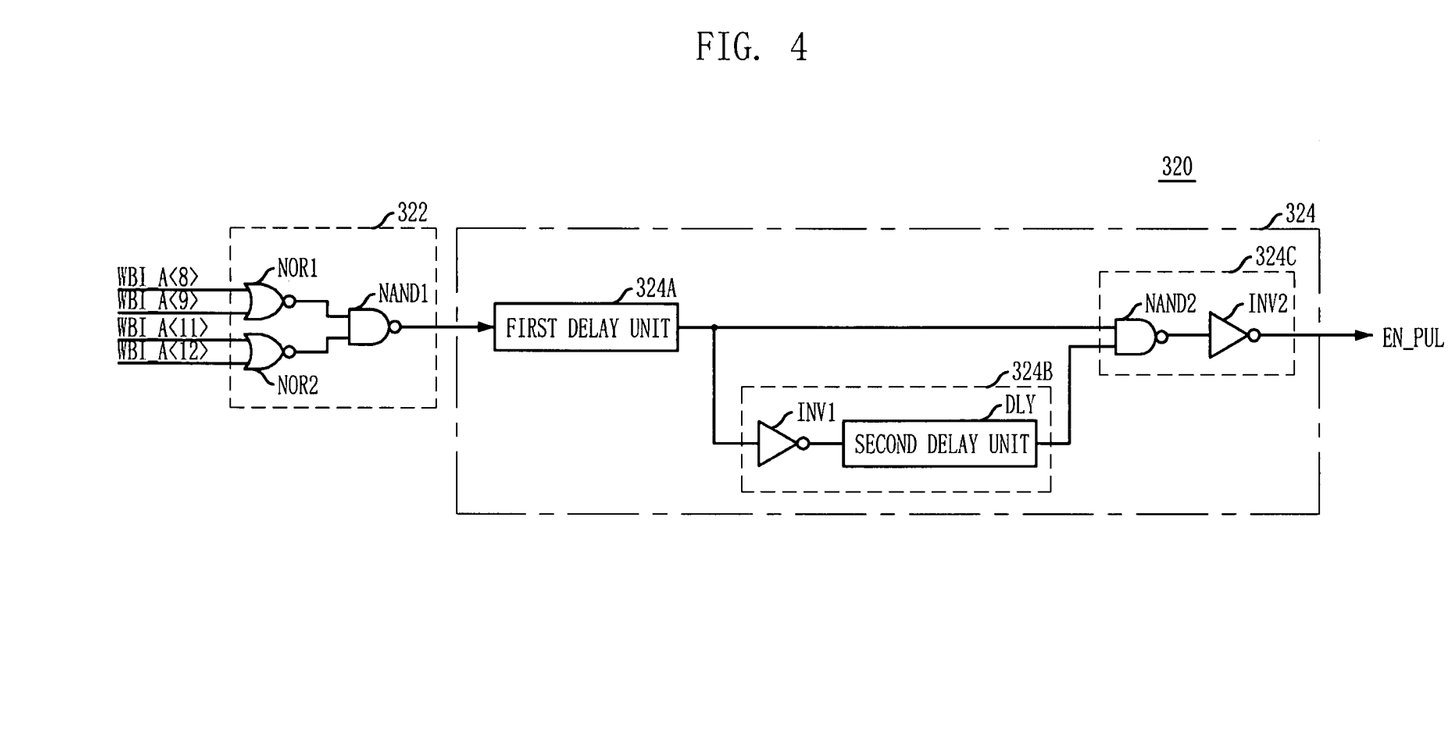
FIG. 4 is a diagram illustrating an enable signal generator of FIG. 3.

FIG. 4 is a diagram illustrating the enable signal generator 320 of FIG. 3.

Referring to FIG. 4, the enable signal generator 320 includes a signal input unit 322 and a pulse generator 324. The signal input unit 322 receives the burn-in test signals through the test transmission paths WBI_A<8>, WBI_A<9>, WBI_A<11> and WBI_A<12> to output a signal reflecting an activation point of at least one of the burn-in test signals. The pulse generator 324 generates the enable signal EN_PUL having a pulse width corresponding to the predetermined period in response to the output signal of the signal input unit 322.

The signal input unit 322 is configured to output a logic 'High' signal when any one of the received burn-in test signals is logically 'High', for example. The signal input unit 322 may include a first NOR gate NOR1, a second NOR gate NOR2, and a first NAND gate NAND1. The first NOR gate NOR1 has an input terminal connected to the test transmission paths WBI_A<8> and WBI_A<9>. The second NOR gate NOR2 has an input terminal connected to the test transmission paths WBI_A<11> and WBI_A<12>. The first NAND gate NAND1 has an input terminal connected to the output terminals of the first and second NOR gates NOR1 and NOR2.

The pulse signal generator 324 may include a first delay unit 324A, an inverting delay unit 324B, and an output unit 324C. The first delay unit 324A delays the output signal of the signal input unit 322 by a predetermined time. The inverting delay unit 324B inverts the output signal of the first delay unit 324A and delays the resulting signal by a predetermined period. The output unit 324C receives the output signal of the first delay unit 324A and the output signal of the inverting delay unit 324B to output the enable signal EN_PUL.

The inverting delay unit 324B may include a first inverter INV1 and a second delay unit DLY. The first inverter INV1 inverts the output signal of the first delay unit 324A, and the second delay unit DLY delays the output signal of the first inverter INV1. The output unit 324C may include a second NAND gate NAND2 and a second inverter INV2. The second NAND gate NAND2 receives the output signal of the first delay unit 324A and the output signal of the inverting delay unit 324B, and the second inverter INV2 outputs the output signal of the second NAND gate NAND2 as the enable signal EN_PUL.

The first delay unit 324A of the enable signal generator 320 is used to consider a time margin that is taken to transmit the burn-in test signals, received through the test transmission paths WBI_A<8>, WBI_A<9>, WBI_A<11> and WBI_A<12>, through a decoding unit 342 to the core region test mode signal output unit 344A (see FIG. 3) and the peripheral region test mode signal output unit 344B (see FIG. 3). The inverting delay unit 324B of the enable signal generator 320 is used to reflect a delay time corresponding to the pulse width of the enable signal EN_PUL.

In result, the output enable signal EN_PUL may be a pulse signal that is activated at an activation point of one of the burn-in test signals received through the test transmission paths WBI_A<8>, WBI_A<9>, WBI_A<11> and WBI_A<12> and has a pulse width corresponding to a predetermined period.

Referring again to FIG. 3, the test mode signal generator 340 may have a decoding unit 342 and a test mode signal output unit 344 in order to receive four burn-in test signals through the test transmission paths WBI_A<8>, WBI_A<9>, WBI_A<11> and WBI_A<12> to generate seven core region test mode signals WBI_TM<1:7> and eight peripheral region test mode signals WBI_TM<8:15>.

The decoding unit 342 decodes the four burn-in test signals received through the test transmission paths WBI_A<8>, WBI_A<9>, WBI_A<11> and WBI_A<12> to generate a plurality of decoding signals DCD_TM<1:15> and a reset signal RST. Thus, the decoding unit 342 may be a 4×16 decoder that receives the burn-in test signals through the test transmission paths WBI_A<8>, WBI_A<9>, WBI_A<11> and WBI_A<12>, decodes fifteen decoding signals DCD_TM<1:15> and a reset signal RST, and outputs 16 output signals.

The test mode signal output unit 344 may include a core region test mode signal output unit 344A and a peripheral region test mode signal output unit 344B. The core region test mode signal output unit 344A seven core region test mode signals WBI_TM<1:7> in response to some of fifteen decoding signals DCD_TM<1:15>, and the peripheral region test mode signal output unit 344B outputs eight peripheral region test mode signals WBI_TM<8:15> in response to the other decoding signals.

The test mode signal output unit 344A may include a plurality of latch units (not illustrated) that latch seven decoding signals in response to the enable signal EN_PUL. Also, the peripheral region controller 360 may include a plurality of latch units corresponding to the peripheral region test mode signals WBI_TM<8:15>. The peripheral region controller 360 may be initialized in response to the reset signal RST output from the decoding unit 342.

Figure 5:
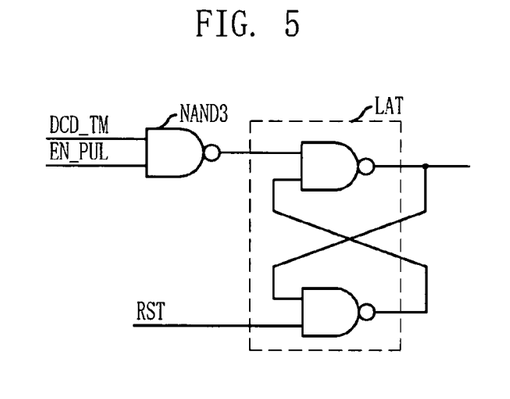
FIG. 5 is a diagram illustrating a latch unit of a core region test mode signal output unit of FIG. 3.

FIG. 5 is a diagram illustrating the latch unit of the core region test mode signal output unit 344A of FIG. 3.

Referring to FIG. 5, the latch unit may include a third NAND gate NAND3 and an SR latch LAT. The third NAND gate NAND 3 outputs a decoding signal DCD_TM corresponding to a core region in response to the enable signal EN_PUL. The SR latch LAT is set in response to the output signal of the third NAND gate NAND3 and is reset in response to the enable signal EN_PUL.

Referring again to FIG. 3, the core region controller 350 controls a plurality of cell arrays disposed in a core region according to seven core region test mode signals WBI_TM<1:7>, so that stresses can be applied to the cell arrays in seven wafer burn-in test modes. For example, under the control of the core region controller 350, all word lines connected to all the cell arrays, odd-numbered word lines, even-numbered word lines, or a given word line may be driven to apply a stress to the corresponding cell array.

The peripheral region controller 360 controls circuits disposed in a peripheral region according to eight peripheral region test mode signals WBI_TM<8:15>, so that eight test operations can be performed on the circuits disposed in the peripheral region.

The operation of the circuits in FIG. 3 will be described hereinafter.

In the wafer burn-in test mode, the burn-in test signals received through the 'A<8>' address pad, the 'A<9>' address pad, the 'A<11>' address pad, and the 'A<12>' address pad are transmitted to the test transmission paths WBI_A<8>, WBI_A<9>, WBI_A<11> and WBI_A<12> according to the wafer burn-in mode signal WBI_ENT. When one of the transmitted signals is activated, the enable signal EN_PUL with a pulse width of a predetermined period is generated.

The burn-in test signals transmitted to the test transmission paths WBI_A<8>, WBI_A<9>, WBI_A<11> and WBI_A<12> are decoded to generate fifteen decoding signals DCD_TM<1:15> and a rest signal RST. In response to the enable signal EN_PUL, the decoding signals DCD_TM<1:15> are output as seven core region test mode signals WBI_TM<1:7> and eight peripheral region test mode signals WBI_TM<8:15>.

In result, the core region controller 350 receives the core region test mode signals WBI_TM<1:7> to apply a stress the cell array in seven wafer burn-in test modes. The peripheral region controller 360 performs eight tests on circuits disposed in the peripheral region.

According to the present invention, the peripheral region test mode signals WBI_TM<8:15> input into the peripheral region controller 360 may be input into the core region controller 350 in order to apply different stresses to the cell arrays.

Figure 6:
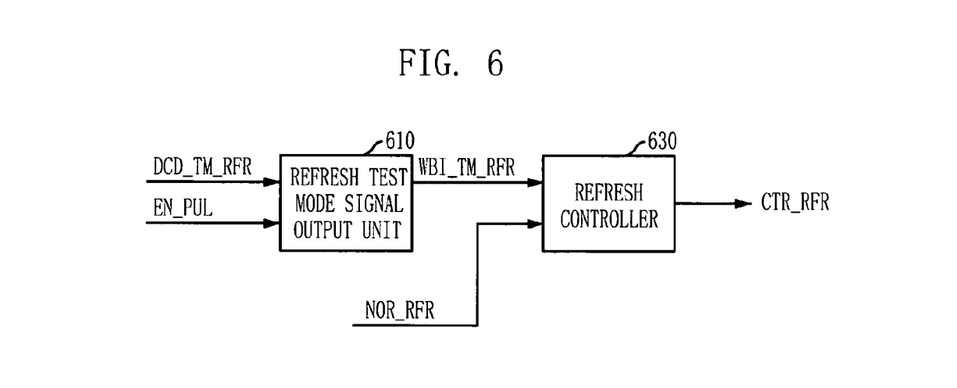
FIG. 6 is a block diagram illustrating an example of the configuration for a refresh operation for a peripheral region controller and a peripheral region test mode signal output unit of FIG. 3.

FIG. 6 is a block diagram illustrating an example of the configuration for a refresh operation for the peripheral region controller 350 and the peripheral region test mode signal output unit 344B of FIG. 3.

Referring to FIG. 6, the peripheral region test mode signal output unit 334B corresponds to a refresh test mode signal output unit 610 and the peripheral region controller 360 corresponds to a refresh controller 630.

The refresh test mode signal output unit 610 outputs a refresh test mode signal WBI_TM_RFR for testing a refresh operation in response to the enable signal EN_PUL and a decoding signal DCD_TM_RFR corresponding to the refresh operation. The refresh controller 630 outputs a refresh control signal CTR_RFR in response to the refresh test mode signal WBI_TM_RFR and a refresh normal mode signal NOR_RFR for a refresh operation in a normal mode. The refresh control signal CTR_RFR is used to control a circuit related to a refresh operation.

Figure 7:
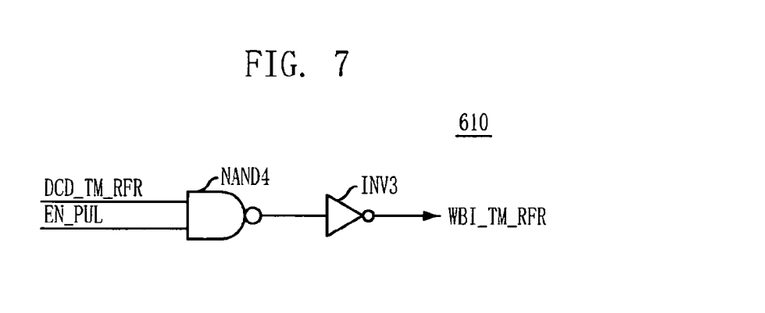
FIG. 7 is a diagram of a refresh test mode signal output unit of FIG. 6.

FIG. 7 is a diagram of the refresh test mode signal output unit 610 of FIG. 6.

Referring to FIG. 7, the refresh test mode signal output unit 610 may include a fourth NAND gate NAND4 and a third inverter INV3. The fourth NAND gate NAND4 receives a decoding signal DCD_TM_RFR corresponding to a refresh operation, and the third inverter INV3 receives the output signal of the fourth NAND gate NAND4 to output a refresh test mode signal WBI_TM_RFR.

Figure 8:
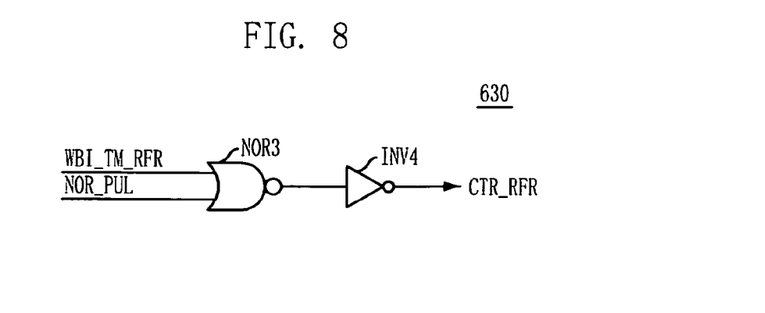
FIG. 8 is a diagram of a refresh controller of FIG. 6.

FIG. 8 is a diagram of the refresh controller 630 of FIG. 6.

Referring to FIG. 8, the refresh controller 630 may include a third NOR gate NOR3 and a fourth inverter INV4. The third NOR gate NOR3 receives a refresh test mode signal WBI_TM_RFR and a refresh normal mode signal NOR_RFT for a refresh operation in a normal operation, and the fourth inverter INV4 receives the output signal of the third NOR gate NOR3 to output a refresh control signal CTR_RFR.

Referring again to FIGS. 7 and 8, in the wafer burn-in test mode, when the enable signal EN_PUL and the decoding signal DCD_TM_RFR corresponding to a refresh operation are activated to a logic 'High' level, the refresh test mode signal WBI_TM_RFT and the refresh control signal CTR_RFR are activated to a logic "High" level to drive a circuit related to the refresh operation. In the normal mode, when the refresh normal mode signal NOR_RFR is activated to a logic 'High' level, the refresh control signal CTR_RFR is activated to a logic "High" level to drive a circuit related to the refresh operation.

Figure 9:
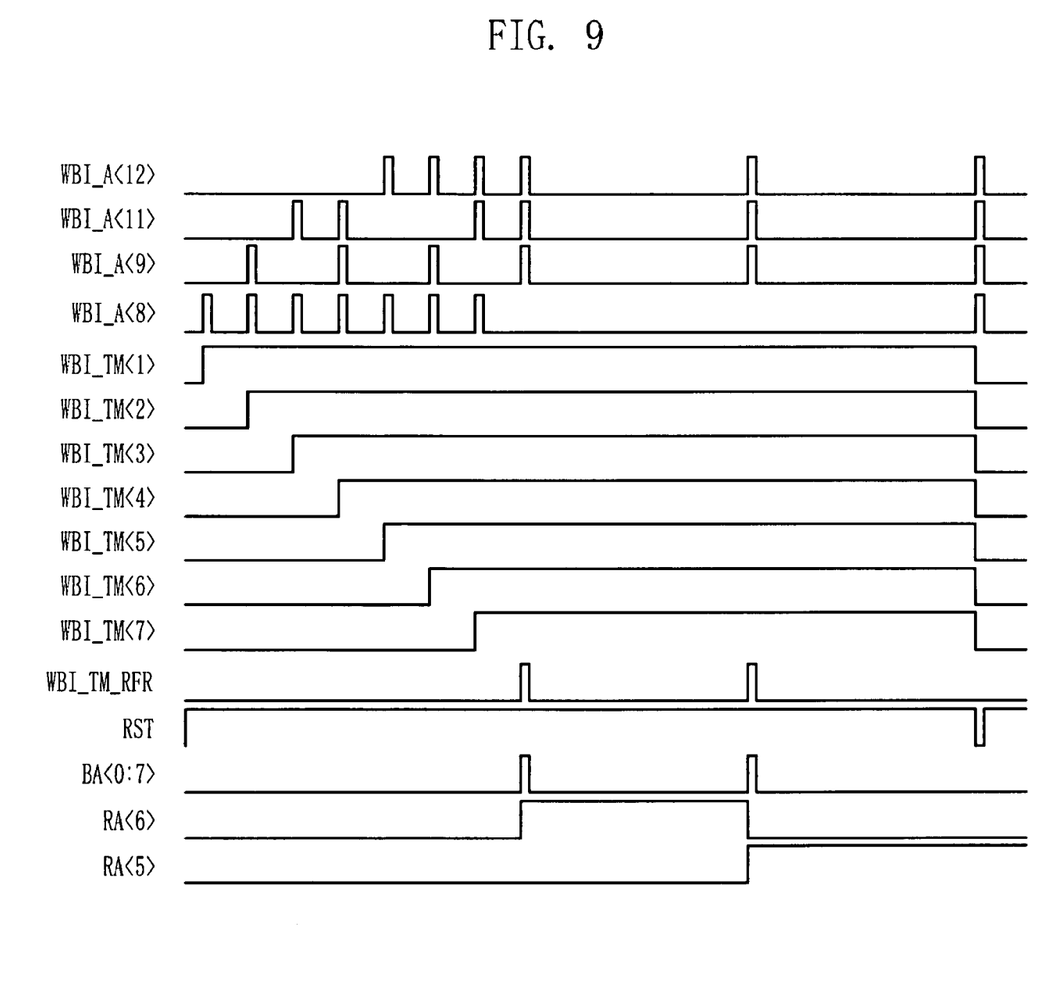
FIG. 9 is a waveform diagram illustrating the waveforms of signals for a refresh operation in accordance with an embodiment of the present invention.

FIG. 9 is a waveform diagram illustrating the waveforms of signals in a refresh operation in accordance with an embodiment of the present invention.

Referring to FIG. 9, the burn-in test signals transmitted through the test transmission paths WBI_A<8>, WBI_A<9>, WBI_A<11> and WBI_A<12>, the core region test mode signals WBI_TM<1:7> for testing a core region, the refresh test mode signal WBI_TM_RFR, the reset signal RST, band enable signals BA<0:7>, and row address signals RA<5> and RA<6> are illustrated.

For reference, the band enable signals BA<0:7> and the row address signals RA<5> and RA<6> are general signals that are activated in a refresh operation. The band enable signals BA<0:7> are used to select one of eight bands. The row address signals RA<5> and RA<6> are signals corresponding to row addresses. In general, word lines are activated sequentially from the world lines corresponding to the row address signals RA<5> and RA<6> in order to perform a refresh operation.

As can be seen from the waveform diagram of FIG. 9, the core region test mode signals WBI_TM<1:7> for a wafer burn-in test mode of a core region and the refresh test mode signal WBI_TM_RFR for testing a refresh operation can be generated through combination of the burn-in test signals transmitted through the test transmission paths WBI_A<8>, WBI_A<9>1 WBI_A<11> and WBI_A<12>. Also, it is possible to generate the reset signal RST that is activated to a logic 'Low' level during the period when the burn-in test signals are all logic 'High'.

Thus, the seven core region test mode signals WBI_TM<1:7> can be used to apply a stress to a circuit disposed in the core region, and the refresh test mode signal WBI_TM_REF can be used to apply a stress to a circuit related to the refresh operation. Accordingly, in the burn-in test mode, the present invention can apply a stress not only to the core region but also to the peripheral region related to the refresh operation, without increasing the number of pads used.

Also, because a relatively small number of word lines corresponding to the row address signals RA<5> and RA<6> are driven, the refresh operation may cause a stress on a sense amplifier.

Conventionally, a signal transmitted through a 'WBI_A<8>' address pad is used to generate only an enable signal EN_PUL. According to the present invention, the signal transmitted through the 'WBI_A<8>' address pad is used to generate not only the enable signal EN_PUL but also the test mode signal. Thus, the semiconductor memory device can provide more wafer burn-in test modes.

Also, the circuits disposed in both the core region and the peripheral region can be tested in the provided test modes. Thus, a test operation can be performed in a wafer level instead of a packet level, thereby making it possible to reduce the time taken to perform the packet-level test.

Also, the refresh operation can be performed in the wafer burn-in test mode. Thus, the refresh circuit and the sense amplifier can be screened through the refresh operation.

As described above, the present invention can provide more burn-in test modes, thereby making it possible to more clearly screen unstable circuits in a semiconductor memory device.

Also, using the additional test modes, the present invention can screen circuits in the peripheral region by applying stresses thereto and can also screen the sense amplifier by driving the refresh circuit.

Also, the present invention performs a test mode in a wafer level instead of a package level, thereby making it possible to reduce the time taken to perform a packet test.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
an enable signal generator configured to generate an enable signal in response to any one of a plurality of burn-in test signals;
a test mode signal generator configured to generate a plurality of peripheral region test mode signals and a plurality of core region test mode signals corresponding to the burn-in test signals in response to the enable signal;
a core region controller configured to control circuits in a core region in response to the core region test mode signals; and
a peripheral region controller configured to control circuits in a peripheral region in response to the peripheral region test mode signals.

2. The semiconductor memory device as recited in claim 1, further comprising a path selector configured to output signals, received through a plurality of pads, as the burn-in test signals through corresponding paths upon entry into a wafer burn-in mode.

3. The semiconductor memory device as recited in claim 1, wherein the enable signal is activated for a predetermined period in response to an activation point of at least one of the burn-in test signals.

4. The semiconductor memory device as recited in claim 1, wherein the enable signal generator comprises:
   a signal input unit configured to receive the burn-in test signals to output a signal reflecting an activation point of at least one of the burn-in test signals; and
   a pulse generator configured to generate the enable signal with a pulse width corresponding to the predetermined period in response to the output signal of the signal input unit.

5. The semiconductor memory device as recited in claim 4, wherein the pulse generator comprises:
   a delay unit configured to delay the output signal of the signal input unit by the predetermined period; and
   an output unit configured to output the enable signal in response to the output signal of the delay unit and the output signal of the signal input unit.

6. The semiconductor memory device as recited in claim 1, wherein the test mode signal generator comprises:
   a decoding unit configured to decode the burn-in test signals to generate a plurality of decoding signals;
   a core region test mode signal output unit configured to output the core region test mode signal in response to the decoding signal corresponding to the core region; and
   a peripheral region test mode signal output unit configured to output the peripheral region test mode signal in response to the decoding signal corresponding to the peripheral region.

7. The semiconductor memory device as recited in claim 6, further comprising a delay unit configured to delay the enable signal by a time margin taken to output the burn-in test signals through the decoding unit.

8. The semiconductor memory device as recited in claim 1, wherein the core region controller and the peripheral region controller are driven in a wafer burn-in mode.

9. A semiconductor memory device, comprising:
   an enable signal generator configured to generate an enable signal in response to any one a plurality of burn-in test signals;
   a decoding unit configured to decode the burn-in test signals to generate a plurality of decoding signals;
   a core region test mode signal output unit configured to operate in response to the enable signal and to output a plurality of core region test mode signals in response to the decoding signal corresponding to a core region;
   a refresh test mode signal output unit configured to operate in response to the enable signal and to output a refresh test mode signal in response to the decoding signal corresponding to a refresh operation;
   a core region controller configured to control circuits in a core region in response to the core region test mode signals; and
   a refresh controller configured to control circuits related to a refresh operation in response to the refresh test mode signal and a refresh normal mod signal.

10. The semiconductor memory device as recited in claim 9, further comprising a path selector configured to output signals, received through a plurality of pads, as the burn-in test signals through corresponding paths, upon entry into a wafer burn-in mode.

11. The semiconductor memory device as recited in claim 9, wherein the enable signal is activated for a predetermined period in response to an activation point of at least one of the burn-in test signals.

12. The semiconductor memory device as recited in claim 9, wherein the enable signal generator comprises:
   a signal input unit configured to receive the burn-in test signals to output a signal reflecting an activation point of at least one of the burn-in test signals; and
   a pulse generator configured to generate the enable signal with a pulse width corresponding to the predetermined period in response to the output signal of the signal input unit.

13. The semiconductor memory device as recited in claim 12, wherein the pulse generator comprises:
   a delay unit configured to delay the output signal of the signal input unit by the predetermined period; and
   an output unit configured to output the enable signal in response to the output signal of the delay unit and the output signal of the signal input unit.

14. The semiconductor memory device as recited in claim 9, wherein the core region test mode signal output unit comprises a plurality of latch units configured to latch the decoding signals and output the core region test mode signals in response to the enable signal.

15. The semiconductor memory device as recited in claim 14, wherein the latch unit is initialized in response to one of the decoding signals.

16. The semiconductor memory device as recited in claim 9, wherein the core region controller and the refresh controller are driven in a wafer burn-in mode.

17. The semiconductor memory device as recited in claim 9, wherein the refresh controller is driven in a refresh operation of a normal mode and a wafer burn-in mode.

18. The semiconductor memory device as recited in claim 9, further comprising a delay unit configured to delay the enable signal by a time margin taken to output the burn-in test signals through the decoding unit.

* * * * *